United States Patent [19]

Hennig

[11] Patent Number: 5,694,091
[45] Date of Patent: Dec. 2, 1997

[54] CIRCUIT ARRANGEMENT TO DOUBLE THE CLOCK FREQUENCY FOR A DATA TRANSMISSION SYSTEM

[75] Inventor: Andreas Hennig, Garbsen, Germany

[73] Assignee: ke Kommunikations-Elektronik GmbH & Co., Hanover, Germany

[21] Appl. No.: 727,095

[22] Filed: Oct. 9, 1996

[30] Foreign Application Priority Data

Nov. 18, 1995 [DE] Germany ............... 195 43 115.4

[51] Int. Cl.$^6$ ............... H03B 1/00; H03B 5/32; H03B 19/00
[52] U.S. Cl. ............... 331/76; 331/158; 331/177 R; 327/122
[58] Field of Search ............... 331/74–77, 177 R, 331/158; 327/119–122

[56] References Cited

U.S. PATENT DOCUMENTS 5,434,522 7/1995 Fikart et al. ............... 327/122

FOREIGN PATENT DOCUMENTS 1075366 2/1984 U.S.S.R. ............... 327/122

OTHER PUBLICATIONS

U. Tietze–Ch. Schenk, Halbleiter–Schaltungstechnik, Springer, Berlin, Heidelberg, New York 1990, pp. 468–473.

*Primary Examiner*—David Mis
*Attorney, Agent, or Firm*—Ware, Fressola, Van Der Sluys & Adolphson LLP

[57] ABSTRACT

A circuit arrangement is indicated to generate a clock frequency for a data transmission system by using a voltage-controlled fundamental wave quartz oscillator (VCXO), whose frequency can be changed within narrow limits as a function of the control voltage. To double the frequency of the fundamental wave quartz oscillator (VCXO), its output (A) is connected to the input of a rectifier bridge circuit (1) having an ohmic resistance (2) placed at its output. The ohmic resistance (2) is connected to both inputs of a comparator (3), and the clock frequency (f) is present at the output of the comparator.

6 Claims, 1 Drawing Sheet

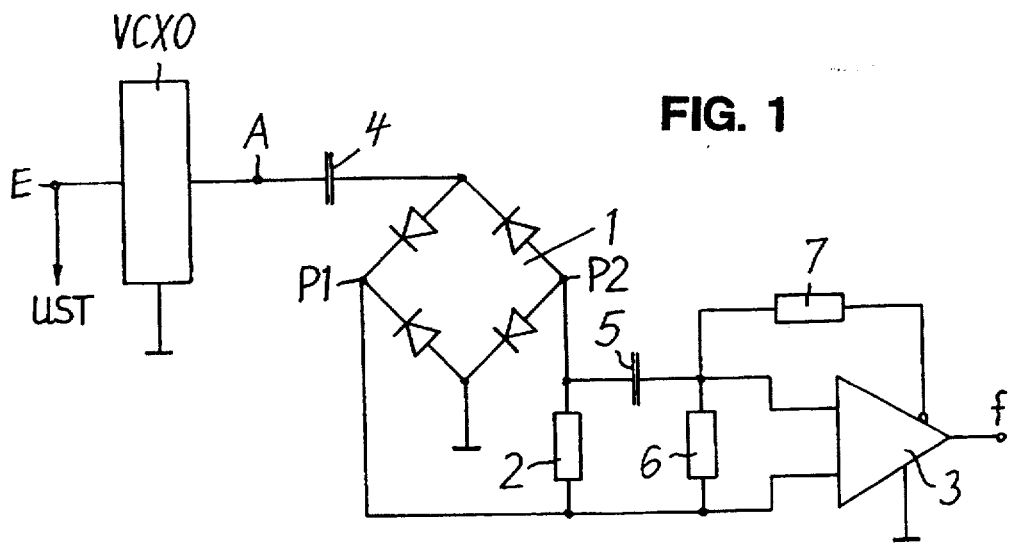
FIG. 1
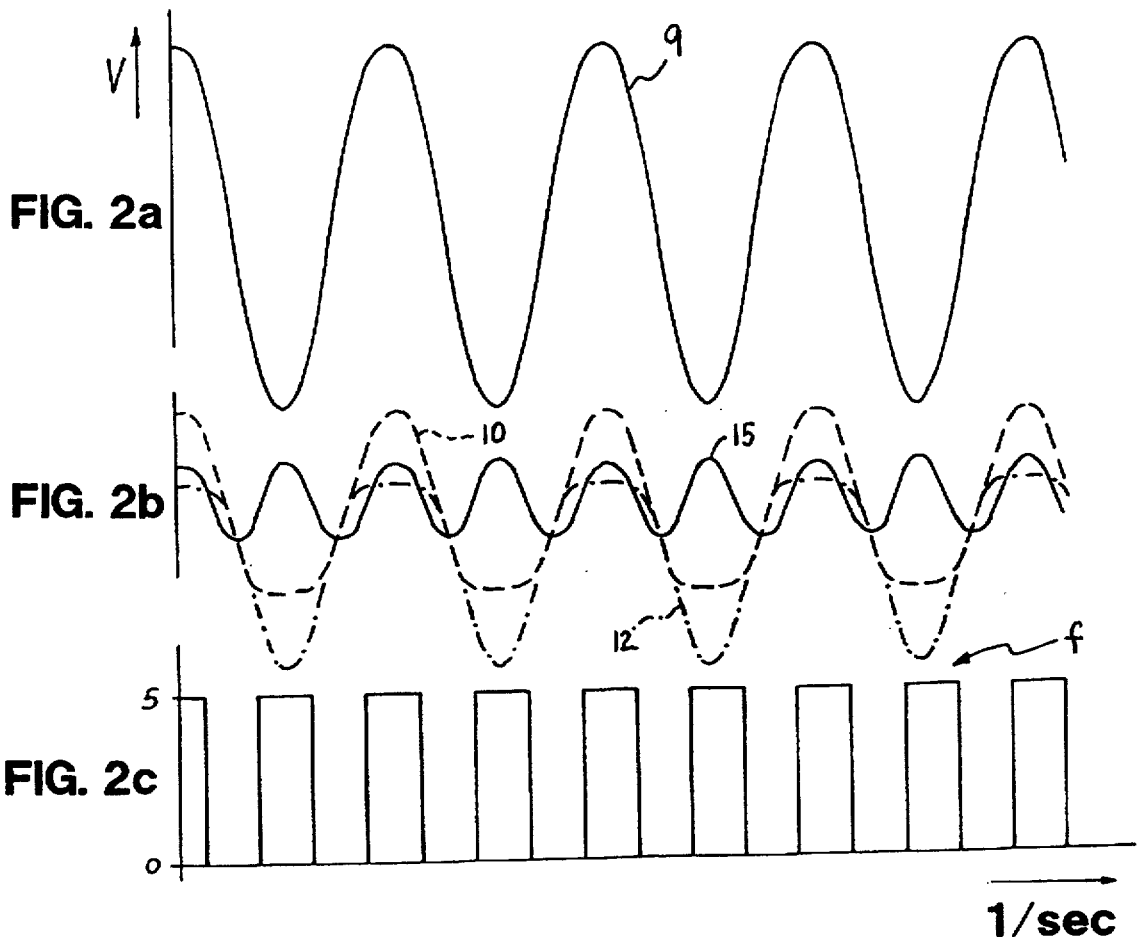
FIG. 2a
FIG. 2b
FIG. 2c

CIRCUIT ARRANGEMENT TO DOUBLE THE CLOCK FREQUENCY FOR A DATA TRANSMISSION SYSTEM

BACKGROUND OF THE INVENTION

1. Technical Field

The invention concerns a circuit arrangement to generate a clock frequency for a data transmission system by using a voltage-controlled fundamental wave quartz oscillator whose frequency can be changed within narrow limits as a function of the control voltage.

2. Description of the Prior Art

Clock frequencies are required for the active components of digital switching mechanisms in general, and for data transmission systems in particular. An example of such a data transmission system is the HDSL system, with a frequency range of about 50 kHz to 500 kHz. Voltage-controlled quartz oscillators, hereafter called "VCXO", are known as the generators of such frequencies. According to the book, "Semiconductor Circuit Technology", by Tietze et al, 9th edition, 1990, Springer Publishers, page 468, the VCXOs may be Pierce oscillators for example. A change in the control voltage of such a VCXO leads to a change in its frequency. This change is limited. The range between the maximum and the minimum frequency is called a "lock-in" range. At a frequency of 28 MHz, the lock-in range is about ±100 ppm for example, thus ±2.8 kHz. The lock-in range becomes smaller with increasing harmonic order.

Fundamental wave VCXOs with frequencies up to 40 MHz are commercially available. Harmonic VCXOs are available for even higher frequencies, however, such harmonic VCXOs have a clearly restricted lock-in range as compared to fundamental wave VCXOs. However, many data transmission systems require clock frequencies that are higher than 40 MHz and have a broad lock-in range. This applies for example to data transmission systems with circuits that contain digital filter ladders in the receiver.

SUMMARY OF THE INVENTION

An object of the present invention is to provide a circuit arrangement for generating a clock frequency above 40 MHz with a lock-in range above ±100 ppm by using a fundamental wave VCXO.

According to the present invention, the output of a fundamental wave quartz oscillator is connected to the input of a rectifier bridge circuit. The output of the rectifier bridge circuit has an ohmic (active) resistance. The ohmic resistance is connected to both inputs of a comparator, and the clock frequency is present at the output of the comparator.

The basis of this circuit arrangement is a VCXO (fundamental wave quartz oscillator) which oscillates at the fundamental wave with a relatively low frequency of 28 MHz for example. This circuit arrangement of the invention doubles the frequency of the VCXO. Therefore, the circuit arrangement of the invention generates a clock frequency of 56 MHz for example. The broad lock-in range of greater than ±100 ppm, which is applicable to the VCXO oscillating at a low frequency, remains in full force for the circuit arrangement providing the higher clock frequency at the output of the comparator. In this way, a high frequency (rectangular frequency) with a broad lock-in range is available at the output of the comparator, which is additionally amplified by the comparator.

To suppress the D.C. part of the frequency provided by the VCXO to the bridge circuit, a capacitor may be connected between the VCXO and the bridge circuit. Additionally, to suppress the D.C. part of the frequency that is present at the ohmic resistance, a high-pass filter including a capacitor and a high-impedance resistor can be connected to the input of the comparator.

The invention will be fully understood when reference is made to the following detailed description taken in conjunction with the accompanying drawings.

BRIEF DESCRIPTION OF THE DRAWINGS

FIG. 1 is a schematic diagram of a circuit arrangement according to the invention; and FIGS. 2a, 2b and 2c illustrate the signal characteristics (signal shape and relative amplitude) of signals present at different points of the circuit arrangement of FIG. 1.

DETAILED DESCRIPTION OF THE INVENTION

Referring to FIG. 1, VCXO designates a fundamental wave quartz oscillator of a well known basic construction, which is therefore not described any further. The VCXO is voltage-controlled. A change in the control voltage UST located at the input E of the VCXO within narrow limits of 0 V to 5 V for example, can change the frequency at an output A of the VCXO within a lock-in range of greater than ±100 ppm. Changes in the frequency at the output of the VCXO may be required for an adaptation of the VCXO to the components of a circuit arrangement including a data transmission path. A low harmonic distortion signal must be available at the output A of the VCXO. The frequency at the output A of the VCXO is therefore preferably sinusoidal 9, as depicted in FIG. 2a.

The frequency generated by the VCXO is directed to a rectifier bridge circuit 1, hereafter called "bridge 1", which has an ohmic (active) resistance 2 connected to its output (P1, P2). Both inputs of a comparator 3 are connected to resistance 2. To suppress D.C. parts of the frequency generated by the VCXO, a capacitor 4 may be connected between its output A and the bridge 1.

The bridge 1 causes an inversion of the negative half-wave of the frequency generated by the VCXO. Accordingly, pole P1 of bridge 1 has the output signal that is drawn with broken lines 10 in FIG. 2b, while pole P2 of bridge 1 has the output signal drawn with dash-dotted lines 12 in FIG. 2b.

These two output signals are supplied to the resistance 2. Thus both inputs of the comparator 3 have an input frequency signal which is drawn with a solid line 15 in FIG. 2b. The comparator input frequency signal 15 is double the frequency 9 (FIG. 2a) of the VCXO. The clock frequency f depicted in FIG. 2c is available at the output of the comparator 3. The comparator 3 acts as an amplifier, so that the clock frequency is double the frequency 9 (FIG. 2a) of the VCXO and its lock-in range is unchanged with respect to the lock-in range of the VCXO. That is, the lock-in range of the circuit arrangement is greater than ±100 ppm. The output level of comparator 3 corresponds for example to a transistor-transistor logic (TTL) level, which is between 0 V and 5 V for example.

To suppress the D.C. part of the frequency that is present at resistance 2, a high-pass filter including a capacitor 5 and a high-impedance resistor 6 may be connected to the input of comparator 3.

The keying ratio of the comparator 3 should be 1:1, if possible. To enable a correction in this instance, an ohmic resistance 7 is provided whereby the output signal of comparator 3 is fed back to one of its inputs.

The invention has been described above with respect to an exemplary embodiment thereof. However, it will be understood that departures can be made by those skilled in the art without departing from the spirit and scope of the invention which is limited only by the following claims.

What is claimed is:

1. A circuit arrangement to generate a clock frequency for a data transmission system comprising:

a voltage-controlled fundamental wave quartz oscillator for providing an output signal at an output of said fundamental wave quartz oscillator, a frequency of said output signal being changed within narrow limits as a function of a magnitude of a control voltage applied to said fundamental wave quartz oscillator;

a rectifier bridge circuit having an input and an output, the input of said rectifier bridge circuit being connected to the output of said fundamental wave quartz oscillator, and the output of said rectifier bridge circuit being connected to an ohmic resistance; and a comparator having two inputs and an output, said ohmic resistance being connected to both inputs of said comparator, and the clock frequency being provided at the output of said comparator.

2. A circuit arrangement as claimed in claim 1, further comprising a high-pass filter including a capacitor and a high-impedance resistor connected between the ohmic resistance and the comparator.

3. A circuit arrangement for generating a clock frequency for a data transmission system, comprising:

a voltage-controlled oscillator for providing an output signal at an output of said voltage-controlled oscillator, a frequency of said output signal being changed within narrow limits as a function of a magnitude of a control voltage applied to said voltage_controlled oscillator;

a rectifier bridge circuit having an input and an output, the input of said rectifier bridge circuit being connected to the output of said voltage-controlled oscillator, and the output of said rectifier bridge circuit being connected to an ohmic resistance; and a comparator having two inputs and an output, said ohmic resistance being connected to both inputs of said comparator, and the clock frequency being provided at the output of said comparator.

4. A circuit arrangement as claimed in claim 3, wherein the frequency of said output signal of said voltage-controlled oscillator changes within a lock-in range of greater than +100 ppm, and wherein the clock frequency at the output of said comparator changes within a lock-in range of greater than ±100 ppm.

5. A circuit arrangement as claimed in claim 3, further comprising filter means for suppressing a DC component of said output signal.

6. (Amended) A circuit arrangement as claimed in claim 5, wherein said filter means includes a high pass filter having a capacitor and a high impedance resistor connected between the ohmic resistance and the comparator.

* * * * *

UNITED STATES PATENT AND TRADEMARK OFFICE
CERTIFICATE OF CORRECTION

PATENT NO. : 5,694,091
DATED :
INVENTOR(S) : December 2, 1997
HENNIG

It is certified that error appears in the above-identified patent and that said Letters Patent is hereby corrected as shown below:

Column 4, claim 3, line 5 "said voltage_ controlled" should read --said voltage-controlled--.

Column 4, claim 4, line 18 "+100 ppm" should read --±100 ppm--.

Column 4, claim 6, delete "(Amended)" on line 24.

Signed and Sealed this

Twentieth Day of October, 1998

Attest:

BRUCE LEHMAN

Attesting Officer    Commissioner of Patents and Trademarks